(12) United States Patent
Upendran et al.

(10) Patent No.: US 7,456,134 B2
(45) Date of Patent: Nov. 25, 2008

(54) PROCESS FOR THE CONTINUOUS PRODUCTION OF MAGNESIUM DIBORIDE BASED SUPERCONDUCTORS

(75) Inventors: Syamaprasad Upendran, Trivandrum (IN); Abhilash Kumar Raveendran Nair Girijakumari Amma, Trivandrum (IN); Vinod Krishnan Kutty, Trivandrum (IN); Aloysius Rajappan Padmavathy, Trivandrum (IN); Sarun Pallian Murikoli, Trivandrum (IN); Thennavarajan Subramanian, Trivandrum (IN); Guruswamy Perumal, Trivandrum (IN)

(73) Assignee: Council of Scientific and Industrial Research, New Delhi (IN)

( * ) Notice: Subject to any disclaimer, the term of this patent is extended or adjusted under 35 U.S.C. 154(b) by 338 days.

(21) Appl. No.: 11/368,901

(22) Filed: Mar. 6, 2006

(65) Prior Publication Data
US 2007/0123427 A1 May 31, 2007

(30) Foreign Application Priority Data
Nov. 25, 2005 (IN) .................. 3156/DEL/2005

(51) Int. Cl.
*H01L 39/24* (2006.01)
*H01B 12/00* (2006.01)

(52) U.S. Cl. .............. 505/431; 505/433; 505/740; 29/599; 148/566; 219/50

(58) Field of Classification Search ............ 505/431, 505/433, 740; 29/599; 148/566; 219/50
See application file for complete search history.

(56) References Cited

U.S. PATENT DOCUMENTS

2005/0170972 A1* 8/2005 Salama et al. .............. 505/430
2005/0174202 A1* 8/2005 Tanaka et al. .................. 335/6

OTHER PUBLICATIONS

Zhang et al "Processing of thin metal strip by casting-cum-rolling", Journal of Materials Processing Technology 192-193 (2007) 101-107.*

* cited by examiner

*Primary Examiner*—Mark Kopec
(74) *Attorney, Agent, or Firm*—Daniel A. Monaco LLP; Drinker Biddle & Reath LLP

(57) ABSTRACT

The present invention provides a simple, energy efficient and cost effective process for continuous production of high quality $MgB_2$ based superconducting wires, tapes, bulk bodies and powders with better phase purity, microstructure and superconducting properties by introducing some innovative steps namely processing the reactants in evacuated and sealed metal tubes by electrical self-heating cum hot rolling followed by annealing under electrical self-heating, thereby overcoming various deficiencies and shortcomings associated with the prior art.

5 Claims, 3 Drawing Sheets

PROCESS FOR THE CONTINUOUS PRODUCTION OF MAGNESIUM DIBORIDE BASED SUPERCONDUCTORS

FIELD OF THE INVENTION

This invention relates to a process for the continuous production of magnesium diboride based superconductors. More particularly the present invention provides a process for the continuous production of magnesium diboride based superconductors in the form of rods, wires, strips, tapes and powder. More specifically, the present invention finds application in power transmission, high field magnets, nuclear magnetic resonance analysis devices, magnetic resonance imaging devices, superconducting energy storage devices, mineral separators, power generators, electric motors, particle accelerators and magnetically levitating trains.

BACKGROUND OF THE INVENTION $MgB_2$ has recently been found to be a superconductor with a critical temperature ($T_C$) of about 40 K, much higher than the best-known intermetallic superconductors [J. Nagamatsu et al "Superconductivity at 39 K in magnesium boride", Nature 410, 63-64, Mar. 1, 2001]. The material is found to have many favourable properties compared to the hitherto known cuprate superconductors and the classical intermetallic superconductors [C. Buzea et al "Review of superconducting properties of $MgB_2$", Superconductor Science & Technology 14, R115-R145, Nov. 5, 2001]. For commercial exploitation of $MgB_2$, it is necessary to invent simple and inexpensive methods to produce the material in the form of high quality powders, dense bulk bodies, long composite conductors with excellent phase purity, microstructure and superconducting properties. The prior art relating to preparation of $MgB_2$ superconducting materials has associated with it a number of problems and deficiencies and these are mainly related to (1) the strong affinity of Mg towards $O_2$ which demands the reaction between Mg and B to be carried out in concealed and/or inert atmosphere, (2) the wide difference in melting points (or vapour pressures) of Mg (650° C.) and B (2080° C.) which necessitates the reaction to be carried out at high pressures, (3) porous and brittle nature of $MgB_2$ which further demands high pressure sintering or compaction in hot stage to obtain the material in dense form, (4) the numerous number of expensive process steps and the associated excessive consumption of energy involved in the production process [N. N. Kolesnikov et al "Synthesis of $MgB_2$ from elements", Physica C 363, 166-169, 2001; Y. Nakamori et al "Synthesis of the binary intermetallic superconductor $MgB_2$ under hydrogen pressure", Journal of Alloys and Compounds 335, L21-24, 2002; C. F. Liu et al "Effect of heat-treatment temperatures on density and porosity in $MgB_2$ superconductor", Physica C 386, 603-606, 2003; C. Dong et al "Rapid preparation of $MgB_2$ superconductor using hybrid microwave synthesis", Superconductor Science & Technology 17, L55-L57, Oct. 6, 2004].

OBJECTIVES OF THE INVENTION

The main objective of the present invention is to provide a simple, energy efficient and cost effective process for the continuous production of high quality $MgB_2$ based superconductors.

Another object is to provide a process for the continuous production of high quality $MgB_2$ based superconducting material in the form of wires, tapes, bulk bodies and powders with better phase purity, microstructure and superconducting properties.

SUMMARY OF THE INVENTION

Accordingly the present invention provides a process for the continuous production of magnesium diboride based superconductors in the form of rods, wires, strips and tapes, the said process comprising the steps of:

a) Taking an one-end closed metal tube and packing it through the open end with a mixture of finely grounded Mg powder and amorphous Boron powder in an atomic ratio in the range of 1:1.8 to 1:2.2, optionally with additives, b) evacuating the above said tube through open end under vacuum of about 0.01 torr by known methods and flattening the unfilled portion of the above said tube, at a pressure of about 1 GPa, c) sealing the open end of the above said packed tube by cold welding without any flux by employing known methods, d) deforming the above said sealed tube by groove or flat rolling to obtain the desired deformed shape of rod or strip, e) electrical self-heating cum hot rolling of the above said deformed rod or strip to a temperature of about 800° C. by passing a suitable current for about 30 minutes, followed by annealing by electrical self-heating and cooling down to room temperature to obtain the desired mono filamentary $MgB_2$ superconducting rod, wire, strip or tape, OR f) packing the several deformed rod or strip obtained in step (d) into another metal tube and repeating the procedure as given above in step (d) and (e) to obtain the desired multifilamentary $MgB_2$ based superconductors in different shape of wire or tape, OR g) grinding off the edges of the metal casing of the rod or strip obtained in step (e) by known methods followed by removal of the metal sheath and subsequent crushing and grinding of the core to obtain $MgB_2$ based superconductor powders.

In an embodiment of the present invention the metal tube used is made of metal selected from the group consisting of Fe, Ni, Nb, Cr, Cu, Ag, their alloys, stainless steel, monel and inconel.

In yet another embodiment the additive used is selected from the group consisting of Al, C, Si, Cu, Ag, Au, Ti, Ta, Nb, Zr, Mg, their oxides and carbides.

In yet another embodiment the groove rolling used is to make metal-sheathed rod or wire for cold and hot deformation.

In yet another embodiment the tape rolling used is to make metal-sheathed strip or tape for cold and hot deformation.

In still another embodiment the another metal tube used in step (f) is made of metal selected from a group consisting of Fe, Ni, Nb, Cr, Cu, Ag, their alloys, stainless steel, monel and inconel.

The novelty of the process lies in reacting the mixture of Mg and Boron powder and other components in an evacuated and sealed metal tubes by electrical self-heating and annealing to obtain the $MgB_2$ based superconducting wires, tapes, bulk bodies and powders.

BRIEF DESCRIPTION OF THE DRAWINGS

The invention is described with respect to the drawings, which are presented for the purpose of illustration and not limiting to the scope of the invention in which.

DETAILED DESCRIPTION OF THE INVENTION

The present invention is concerned with the production of high quality $MgB_2$ superconductor in the form of wires, tapes, bulk bodies and powders. The deficiencies associated with the prior art for the preparation of all the above forms of $MgB_2$ and the solutions found in the present invention in different process steps are described as follows.
1. The oxidation and evaporation loss of Mg is suppressed by packing the reaction mixture in evacuated and sealed metal tubes. The method also eliminates the need for costly inert gases or expensive vacuum furnaces for heat treatment.
2. The self-generated Mg vapour pressure inside the sealed tube during electrical self-heating accelerates the $MgB_2$ formation rate and hence the formation takes place at a lower temperature in lesser time. The step, therefore, further reduces energy requirements.
3. The porous $MgB_2$ formed in situ within the sealed tube is subjected to simultaneous rolling in the hot stage. The electrical self-heating not only allows the reaction to take place but also enables hot rolling. In other words, two important process steps are carried out in a single stage. This again reduces the energy consumption. Self-heating also saves a significant amount of electrical energy compared to heating the sample in an electrically heated furnace. The step ensures a better densification of the otherwise brittle $MgB_2$ core.
4. The rod/wire/strip/tape obtained after hot rolling is subjected to annealing again under electrical self-heating. The step ensures better phase purity, grain connectivity and relieval of stress and hence lead to higher critical current density for the $MgB_2$ superconductors.

Figure 1:
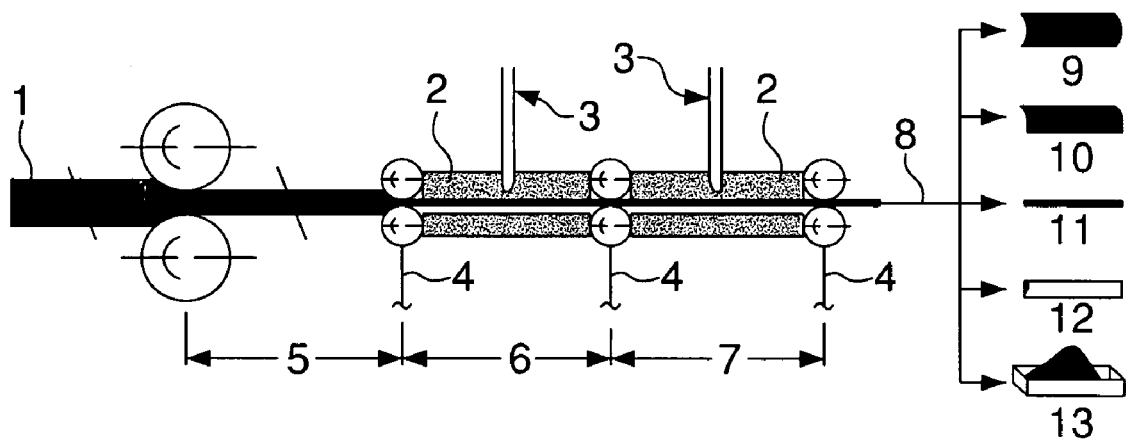
FIG. 1. Method for continuous production of superconducting $MgB_2$ rods, strips, wires, tapes and powders by electrical self-heating cum hot rolling and annealing useful in accordance with the methods of this invention. The relevant parts, process steps and products referred in the drawing are given below:
1. Evacuated and sealed metal tube filled with Mg and B powders
2. Thermal insulator
3. Thermocouples
4. Electrical leads to the power supply for self-heating the sample
5. Process stage I: Diameter reduction and compaction
6. Process stage II: Electrical self-heating cum hot-rolling
7. Process stage III: Annealing under electrical self-heating
8. Products
9. Rod
10. Strip
11. Wire
12. Tape
13. Powder FIG. 2. A typical powder X-ray diffraction pattern of $MgB_2$ superconductor prepared in accordance with the methods of this invention.

FIG. 1 discloses the process of continuous production of $MgB_2$ rods, strips, wires, tapes and powders in accordance with the method of this invention, which comprises the following stages:

Stage-I, wherein an evacuated and sealed metal tube containing a mixture of Mg and B powders together with other additives is rolled to obtain a compacted powder-in-tube or strip of desired diameter or thickness. For obtaining rods or wires, groove rolling is adopted whereas for strips and tapes, flat rolling is adopted.

Stage-II, wherein the said powder-in-tube or strip is electrically self heated to a temperature required for $MgB_2$ formation by passing a current through it and simultaneously hot rolled to a desired diameter/or thickness.

Stage-III, wherein the metal sheathed hot rolled $MgB_2$ tube/wire/strip/tape is subjected to annealing at high temperature by electrical self-heating. The durations of heat treatment in stage-II and annealing in stage-III are decided by the rolling speed and the length of the sample in the two different stages. Stage-III ensures conversion of any unreacted residual reactants into the superconducting phase and enables healing of any microcracks developed in the core, grain coarsening and relieval of stress caused due to the thermomechanical processing.

After stage-III, suitable additional stages are incorporated to the system depending on the product desired. For superconducting wires and tapes, the product obtained in stage-III is directly wound on spools. For rods and strips, the product obtained in stage-III is cut into pieces of desired length and the metallic sheath is peeled off mechanically. For powders, the product obtained in the form of rod or strip is further subjected to crushing and grinding.

Figure 2:
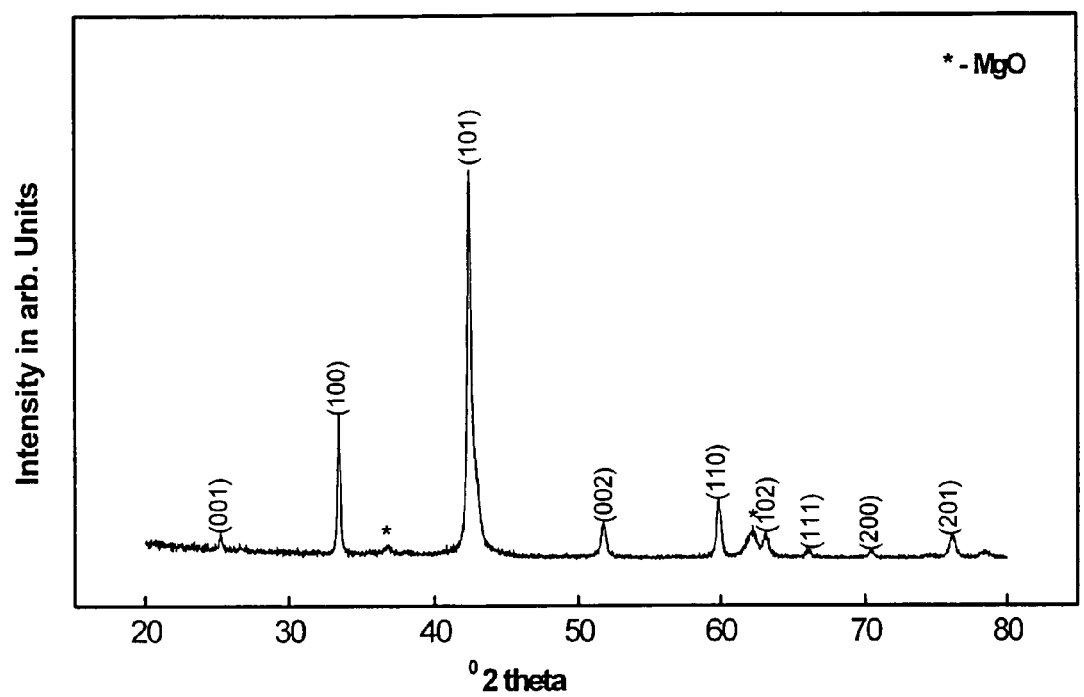
Figure 3:
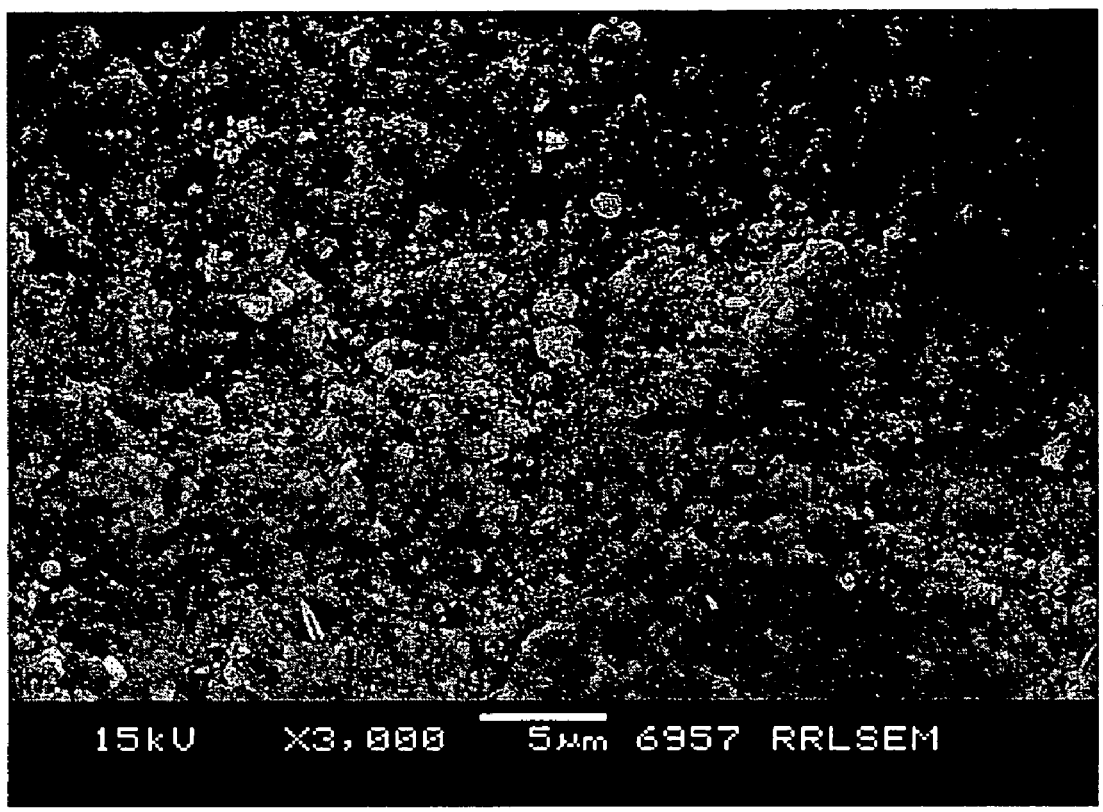
FIG. 3. A typical micrograph of $MgB_2$ superconductor prepared in accordance with the methods of this invention.

Referring to FIGS. 2 and 3, FIG. 2 shows a typical power X-ray diffraction pattern of $MgB_2$ prepared in accordance with the method of this invention which establishes that the product formed is pure $MgB_2$ with only a trace of MgO which co-exists with $MgB_2$ and FIG. 3 shows a typical scanning electron micrograph of $MgB_2$ prepared in accordance with the method of this invention which depicts the characteristic features of $MgB_2$ superconductor.

The present invention is further illustrated by the following examples. However, the examples should not be construed as limiting the scope of the invention.

EXAMPLE 1

The example will show how to make an $MgB_2$ superconducting bulk body in the form of a plate or strip and powders by electrical self-heating of compacted and sealed metal tubes. A stainless steel tube (SS304, OD/ID=6/4 mm and length=12 cm) was taken and cleaned. One end portion of the tube of about 3 cm was flattened by uniaxial pressing between two hardened die-steel blocks using a hydraulic press at a pressure of 1 GPa. A finely ground mixture of Mg powder (Alfa Aesar, purity: 99.8%, mesh: −325) and amorphous B powder (Alfa Aesar, purity: 99%, mesh: −325) in the atomic ratio 1:2 was packed into the tube to a length of about 5 cm through the open end of the tube. The tube was then evacuated to a vacuum of 0.01 torr by connecting it to a rotary vacuum pump. During evacuation, the unfilled portion of the tube was also flattened by pressing at a pressure of 1 GPa. Having evacuated and sealed both ends, the powder filled portion of the tube was compacted by uniaxial pressing at a pressure of 1 GPa. The ends of the flattened tube was then welded and sealed permanently. The welding is performed without any flux employing a constant dc current source operating at low power. A wet cloth is wound around the sample during welding to avoid heating up of the sample (referred to as 'cold welding' in the subsequent description). The ends of the sample were connected to a dc constant current source. The sample was thermally insulated using alumina boards. At the middle of the sample, a thermocouple was kept to monitor the temperature. The sample was then electrically self-heated to a temperature of 800° C. with a ramp rate of about 50° C. per minute by passing a maximum current of 90 A in steps. The sample was soaked at this temperature for 30 minutes and then slowly cooled down to room temperature. The powder packed portion of the sample was cut out. The edges of the metal casing were ground off using a grinding wheel. The $MgB_2$ superconductor in the form of a rectangular plate of size 45 mm×8 mm×1.5 mm was recovered after removing the metal sheath. One half of the rectangular plate was cut separately and ground using an agate mortar and pestle to obtain $MgB_2$ powder. Both the $MgB_2$ plate and the powder were tested for phase purity, microstructure and superconducting properties and these were found to be excellent.

EXAMPLE 2

The example will show how to make monofilamentary $MgB_2$ superconducting wires and tapes by electrical self-heating cum hot rolling and annealing.

An evacuated and sealed stainless steel tube (SS304, OD/ID=6/4 mm, length=12 cm) containing a mixture of Mg powder (Alfa Aesar, purity : 99.8%, mesh : −325) and amorphous B powder (Alfa Aesar, purity: 99%, mesh: −325 was prepared by following the procedure illustrated in Example 1. It was subjected to cold rolling to obtain a wire of diameter 2 mm. One piece of the wire of length 20 cm is subjected to electrical self-heating cum hot groove-rolling at 800° C. for 30 minutes by passing a current of 15 A as illustrated in stage-II of FIG. 1 so as to obtain a hot rolled wire of diameter 1.4 mm. The wire was then subjected to annealing under electrical self-heating at 800° C. for 30 minutes by passing a current of 8 A as illustrated in stage-III of FIG. 1 and slowly cooled to obtain $MgB_2$ superconducting wire. Another piece of cold rolled wire (diameter=2 mm, length=20 cm) is subjected to electrical self-heating cum flat-rolling at 800° C. for 30 minutes, followed by annealing by electrical self-heating at 800° C. for 30 minutes and slow cooling to obtain $MgB_2$ superconducting tape of thickness 0.5 mm. The wire and tape were tested for phase purity, microstructure and superconducting properties and these were found to be excellent.

EXAMPLE 3

The example will show how to make an $MgB_2$ superconducting wire in multifilamentary configuration by electrical self-heating cum hot rolling and annealing. As illustrated in examples 1 and 2, cold rolled monofilamentary wires of 2 mm diameter and length 10 cm containing the reaction mixture were initially made. The end-sealed wires were then packed into another stainless steel tube (SS304, OD/ID=10/7 mm, length=10 cm). The wire packed tube was cold-rolled using groove rollers to obtain a multifilamentary wire of diameter 5 mm. The wire is then subjected to electrical self-heating cum hot groove rolling at 800° C. for 30 minutes by passing a current of 95 A as illustrated in stage-II of FIG. 1 to obtain a multifilamentary wire of diameter 3 mm. It was then subjected to annealing under electrical self-heating at 800° C. for 30 minutes by passing a current of 35 A as illustrated in stage-III of FIG. 1, followed by slow cooling. The multifilamentary $MgB_2$ superconducting wire thus obtained was tested for phase purity, microstructure and superconducting properties and these were found to be excellent.

Advantages

1. The process is a simple, energy efficient and cost effective.
2. This process provides high quality $MgB_2$ based superconducting wires, tapes, bulk bodies and powders with better phase purity, microstructure and superconducting properties.
3. The process is continuous.

We claim:

1. A process for the continuous production of magnesium diboride based superconductors in the form of rods, wires, strips or tapes, the process comprising the steps of:
    a) packing an one-end closed metal tube through the open end thereof with a mixture of finely grounded magnesium powder and amorphous boron powder in an atomic ratio in the range of 1:1.8 to 1:2.2, optionally with one or more additives,
    b) evacuating said tube through the open end thereof under a vacuum of about 0.01 torr and flattening the unfilled portion of the tube, at a pressure of about 1 GPa,
    c) sealing the open end of the packed tube by cold welding without any flux,
    d) deforming the sealed tube by groove or flat rolling to obtain the shape of a rod or a strip, and
    e) (i) electrical self-heating the rod or strip obtained in step (d) with hot rolling to a temperature of about 800° C. by passing a suitable current therethrough for about 30 minutes, followed by annealing by electrical self-heating and cooling down to room temperature to obtain a mono filamentary magnesium diboride superconducting rod, wire, strip or tape, or
    (ii) packing a plurality of rods or strips obtained in step (d) into another metal tube, deforming the metal tube by groove or flat rolling to obtain a rod or strip, electrical self-heating the rod or strip with hot rolling to a temperature of about 800° C. by passing a suitable current therethrough for about 30 minutes, followed by annealing by electrical self-heating and cooling down to room temperature to obtain multifilamentary magnesium diboride based superconductors in the shape of a wire or a tape.

2. A process as claimed in claim 1, wherein the metal tube is made of a metal selected from the group consisting of Fe, Ni, Nb, Cr, Cu, Ag, and their alloys.

3. A process as claimed in clam 1, wherein the additive in step (a) is selected from the group consisting of Al, C, Si, Cu, Ag, Au, Ti, Ta, Nb, Zr, Mg, their oxides and their carbides.

4. A process as claimed in claim 1, wherein the metal tube packed in step (e)(ii) is made of a metal selected from the group consisting of Fe, Ni, Nb, Cr, Cu, Ag, and their alloys.

5. A process for the preparation of an magnesium diboride based superconductor powder comprising:
    forming a monofilamentary magnesium diboride superconducting rod or strip according to claim 1, comprising a metal sheath surrounding a core;
    removing the metal sheath from the core of said rod or strip; and
    crushing and grinding the core to obtain a magnesium diboride based superconductor powder.

* * * * *